United States Patent [19]
Oosawa et al.

[11] Patent Number: 5,984,607
[45] Date of Patent: Nov. 16, 1999

[54] TRANSFER APPARATUS, TRANSFER METHOD, TREATMENT APPARATUS AND TREATMENT METHOD

[75] Inventors: Tetsu Oosawa; Harunori Ushikawa, both of Sagamihara, Japan

[73] Assignee: Tokyo Electron Limited, Tokyo, Japan

[21] Appl. No.: 08/849,744

[22] PCT Filed: Nov. 6, 1996

[86] PCT No.: PCT/JP96/03241

§ 371 Date: Jul. 3, 1997

§ 102(e) Date: Jul. 3, 1997

[87] PCT Pub. No.: WO97/17728

PCT Pub. Date: May 15, 1997

[30] Foreign Application Priority Data

Nov. 6, 1995 [JP] Japan ................................. 7-311602

[51] Int. Cl.$^6$ ..................................................... B65H 3/00
[52] U.S. Cl. ........................ 414/222; 414/806; 414/808; 414/937
[58] Field of Search .................... 414/937, 939, 414/940, 416, 222, 806, 807, 808

[56] References Cited

U.S. PATENT DOCUMENTS

| | | | |
|---|---|---|---|
| 4,775,281 | 10/1988 | Prentakis | 414/939 X |
| 5,439,547 | 8/1995 | Kumagai | 414/940 X |
| 5,570,994 | 11/1996 | Somekh et al. | 414/937 X |
| 5,810,538 | 9/1998 | Ozawa et al. | 414/937 X |

FOREIGN PATENT DOCUMENTS

| | | |
|---|---|---|
| 2-139948 | 5/1990 | Japan . |
| 5-326666 | 12/1993 | Japan . |
| 7-29963 | 1/1995 | Japan . |

*Primary Examiner*—Donald W. Underwood
*Attorney, Agent, or Firm*—Oblon, Spivak, McClelland, Maier & Neustadt, P.C.

[57] ABSTRACT

The present invention provides a transfer apparatus and a transfer method capable of reducing the time required for transferring a plurality of to-be-transferred objects, and a treatment apparatus and a treatment method capable of increasing the throughput. The transfer apparatus, wherein the objects are transferred from a first support unit supporting the objects to a second support unit capable of supporting the objects, comprising load/unload means for unloading the objects one by one from the first support unit in a first position in which the objects can be carried out of the first support unit, and loading the objects into the second support unit one by one in a second position in which the objects can be carried into the second support unit, a third support unit for permitting loading and unloading of the objects by the load/unload means, the third support unit being capable of supporting the objects, and transfer means for moving the load/unload means from the first position to the second position.

22 Claims, 12 Drawing Sheets

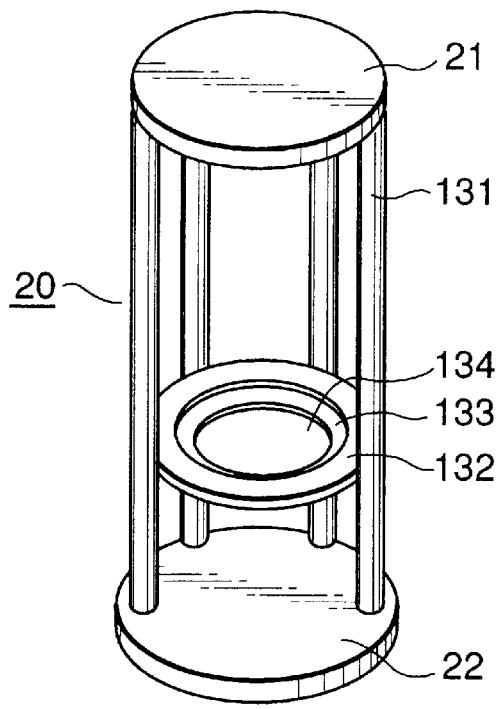
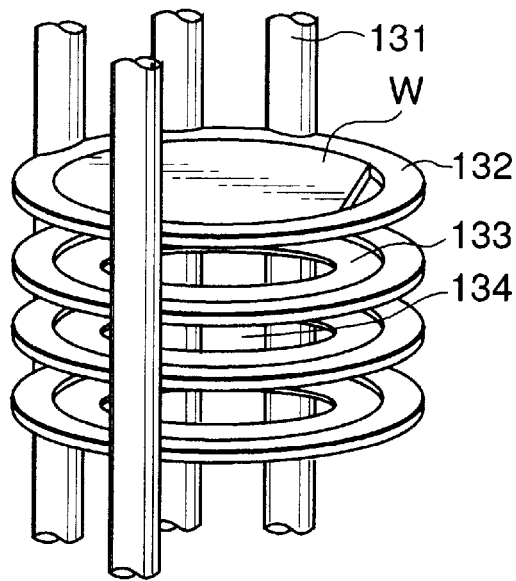
FIG.13  FIG.14
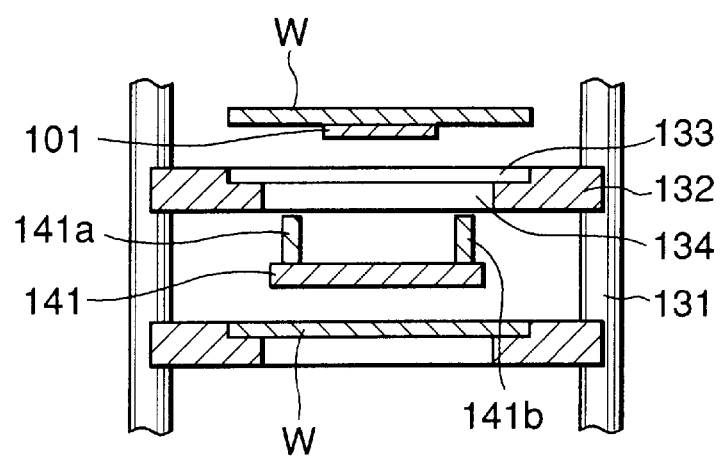
FIG.15

TRANSFER APPARATUS, TRANSFER METHOD, TREATMENT APPARATUS AND TREATMENT METHOD

TECHNICAL FIELD

This invention relates to a transfer apparatus, a transfer method, a treatment apparatus and a treatment method for use in a process for manufacturing semiconductor devices.

BACKGROUND ART

A conventional treatment apparatus used in a process for manufacturing semiconductor devices is known from, for example, Japanese Patent Application KOKAI Publication No. 63-24615. At the time of subjecting objects to be treated, such as semiconductor wafers (hereinafter referred to simply as "wafers"), to a predetermined treatment, a plurality of wafers are transferred from a cassette as a first support member to a wafer boat as a second support member by means of transfer means, thereby performing the predetermined treatment.

More specifically, to transfer wafers from the cassette to the wafer boat, load/unload means for loading and unloading wafers therebetween is moved first to a first position in which wafers can be carried out of the cassette, thereby carrying a single wafer out of the cassette, and then to a second position in which wafers can be carried into the wafer boat, thereby loading the single wafer into the wafer boat by the load/unload means.

Since in this treatment apparatus, the load/unload means is moved between the first and second positions each time it transfers a single wafer, a great amount of time is required to transfer a plurality of wafers from the cassette to the wafer boat, which is the major cause of hindrance to increase the throughput of the treatment apparatus. Accordingly, a long time is required to completely transfer all wafers contained in the cassette, and therefore it is necessary to keep the cassette for a long time in a position in which the wafers can be carried out by means of the load/unload means.

SUMMARY OF THE INVENTION

It is a first object of the invention to provide a transfer apparatus capable of transferring a to-be-transferred object in a short time.

It is a second object of the invention to provide a transfer method which enables a to-be-transferred object to be transferred in a short time.

It is a third object of the invention to provide a treatment apparatus capable of increasing the throughput.

It is a fourth object of the invention to provide a treatment method capable of reducing the time required to transfer a to-be-transferred object, thereby increasing the throughput.

According to a first aspect of the invention, there is provided a transfer apparatus for transferring a plurality of to-be-transferred objects from a first support unit supporting the objects to a second support unit capable of supporting the objects, comprising:

load/unload means for unloading the objects one by one from the first support unit in a first position in which the objects can be carried out of the first support unit, and loading the objects one by one into the second support unit in a second position in which the objects can be carried into the second support unit;

a third support unit for permitting loading and unloading of the objects by the load/unload means, the third support unit being capable of supporting the objects; and transfer means for moving the load/unload means from the first position to the second position.

According to a second aspect of the invention, there is provided a treatment apparatus for transferring a plurality of to-be-transferred objects from a first support unit supporting the objects to a second support unit capable of supporting the objects, and subjecting to a predetermined treatment the objects supported by the second support unit, comprising:

load/unload means for unloading the objects one by one out of the first support unit from a first position in which the objects can be carried out of the first support unit, and loading the objects into the second support unit one by one in a second position in which the objects can be carried into the second support unit;

a third support unit for permitting loading and unloading of the objects by the load/unload means, the third support unit being capable of supporting the objects;

transfer means for moving the load/unload means from the first position to the second position; and treatment means for treating the objects supported by the second support unit.

According to a third aspect of the invention, there is provided a method of transferring a plurality of to-be-transferred objects from a first support unit supporting the objects to a second support unit capable of supporting the objects, comprising the steps of:

loading the objects one by one out of the first support unit into a third support unit capable of supporting the objects;

transferring the third support unit with the objects to a position in which the objects can be transferred to the second support unit; and unloading the objects one by one from the third support unit, then loading the objects into the second support unit.

According to a fourth aspect of the invention, there is provided a method of subjecting, to a predetermined treatment, a plurality of to-be-treated objects transferred from a first support unit to a second support unit, comprising the steps of:

loading the objects one by one out of the first support unit into a third support unit capable of supporting the objects;

transferring the third support unit with the objects to a position in which the objects can be transferred to the second support unit;

unloading the objects one by one from the third support unit, then loading the objects into the second support unit;

transferring the second support unit with the objects to a treatment section; and subjecting the objects supported by the second support unit to the predetermined treatment in the treatment section.

The transfer apparatus and transfer method of the present invention can reduce the time required for transferring a plurality of to-be-transferred objects. Further, the treatment apparatus and treatment method of the invention can increase the throughput.

BRIEF DESCRIPTION OF DRAWINGS

FIG. 13 is a perspective view, showing a second support member employed in a third embodiment of the present invention;

FIG. 14 is a perspective view, showing the second support member employed in the third embodiment of the present invention;

FIG. 15 is a sectional view, showing the second support member employed in the third embodiment of the present invention;

BEST MODE OF CARRYING OUT THE INVENTION

The embodiments of the invention will be described with reference to FIGS. 1–18. The embodiments are obtained by applying the invention to a longitudinal heat treatment apparatus.

Figure 1:
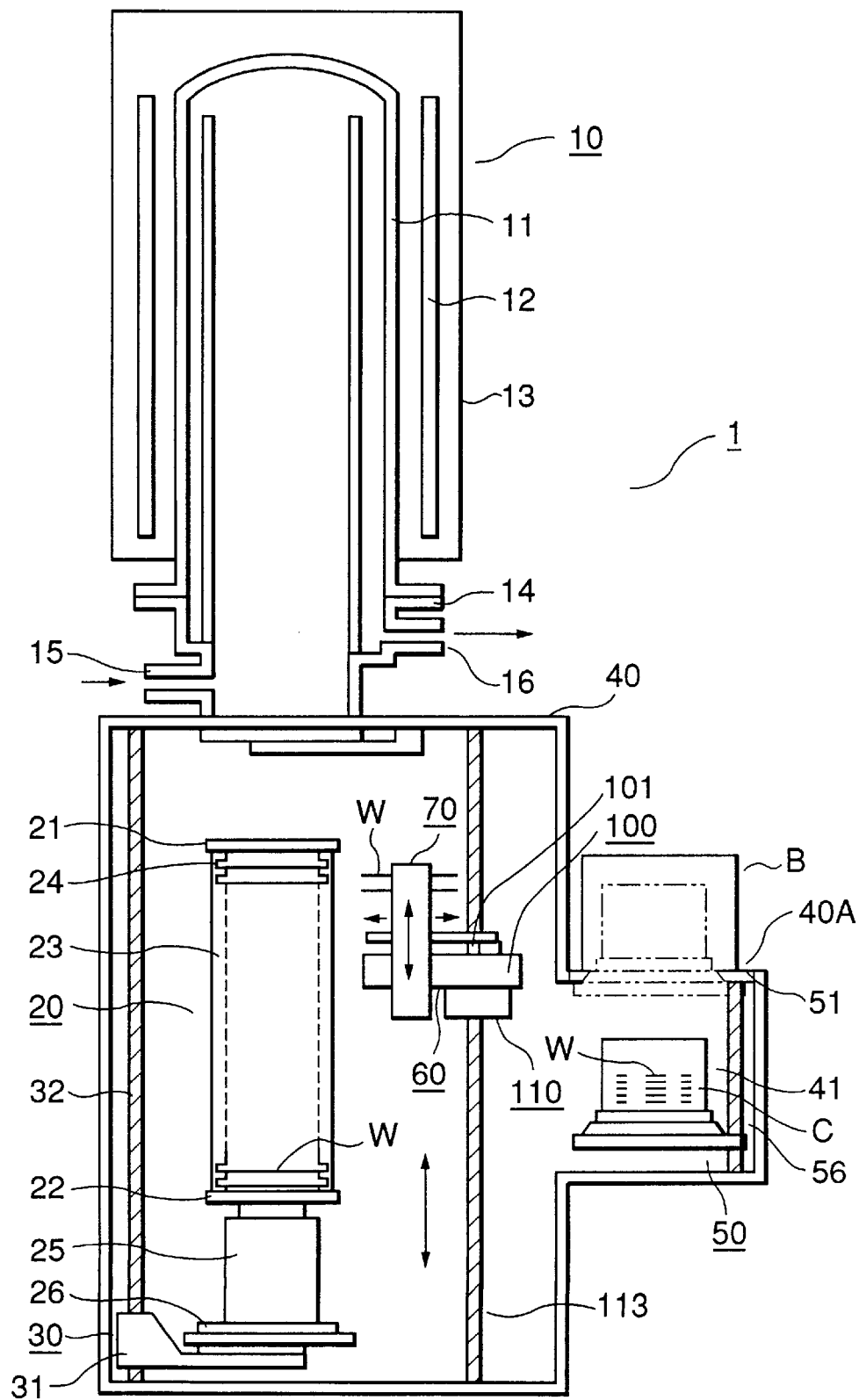
FIG. 1 is a schematic sectional view, showing the overall structure of a first embodiment of the present invention.

As is shown in FIG. 1, a vertical heat treatment apparatus 1 comprises:

- a treatment unit 10 for subjecting an object to be treated such as a semiconductor wafer (hereinafter referred to simply as a "wafer") to a predetermined heat treatment;
- a load chamber 40 having load means 30 housed therein for loading, into the treatment unit, a second support member such as a wafer boat 20 which contains a plurality of wafers W;
- a take-in mechanism 50 for taking, out of an airtight container B into the load chamber 40, a carrier C as a first support member for containing and supporting a plurality of wafers W;
- transfer means 60 housed in the load chamber 40 for transferring wafers W from the carrier C to the wafer boat 20 or from the wafer boat 20 to the carrier C; and
- a temporally mounting stage 70 situated in a position in which wafers W can be loaded and unloaded by the transfer means 60, and serving as a third support member for containing and supporting a plurality of wafers W.

The treatment unit 10 has a treatment container 11 for loading therein the wafer boat 20 with wafers W and subjecting it to a predetermined heat treatment. The treatment container 11 has a substantially cylindrical shape with a lower open end. Further, a heater 12, for example, is provided outside the treatment container 11 as a heating source for heating wafers W loaded therein. A protect cover 13 incorporating a cooling pipe, a heat insulating material or the like is provided outside the heater 12. A manifold 14 is provided at the lower open end of the treatment container 11. The manifold 14 is a substantially cylindrical member with upper and lower flange portions formed at upper and lower open ends thereof, respectively. The upper flange portion of the manifold 14 is attached to the lower open end of the treatment container 11. The manifold 14 closes the lower open end in an airtight manner. Further, the manifold 14 has a gas inlet port 15 formed in a peripheral wall portion thereof for introducing a predetermined gas into the treatment container 11, and an exhaust port 16 formed in a peripheral wall portion thereof for discharging gas in the container 11. Gas inlet means and exhaust means are connected to the gas inlet port 15 and the exhaust port 16, respectively. As described above, the treatment unit 10 is adapted to heat the wafers W loaded in the treatment container 11 to a predetermined temperature, to introduce a predetermined treatment gas through the gas inlet port 15, and to subject the wafers W to a predetermined heat treatment.

The load chamber 40 is connected to the lower end of the treatment unit 10 such that the chamber 40 communicates with the treatment container 11. The load chamber 40 is of a sealed structure, and connected to inactive gas introducing means and inactive gas discharging means (not shown) at upper and lower portions thereof, respectively.

The wafer boat 20 has an upper end plate 21, a lower end plate 22, and a plurality of support columns 23 attached such that they surround a circumference of the wafer W and bridge the upper and lower plates 21 and 22. Each support column 23 has a plurality (e.g. 150) of support projections 24 provided at regular intervals in the vertical direction for supporting edge portions of the wafers W. Thus, the wafer boat 20 can support a plurality of wafers W at regular intervals in the vertical direction such that each wafer is positioned horizontally. The support columns 23 are arranged such that each wafer W can be transferred between the support projections 24 and a fork 101 (which will be described later) by horizontally moving the fork 101 through the columns. Moreover, the wafer boat 20 is placed on a heat retaining cylinder 25, which is placed on a lid member 26. When the wafer boat 20 is loaded into the treatment unit 10, the heat retaining cylinder 25 is loaded together with the boat. At this time, the lower open end of the manifold 14 is closed with the lid member 26 in an airtight manner.

Load means 30 is provided in the load chamber 40 and below the treatment unit 10. The load means 30 includes a boat elevator 31 for supporting the lid member 26, the heat retaining cylinder 25 and the wafer boat 20, and a driving mechanism for vertically moving the boat elevator 31, such as a ball screw mechanism 32. The ball screw mechanism 32 includes a nut fixed to the boat elevator 31, a ball screw engaged with the nut, rotary means for rotating the ball screw, such as a motor, and a linear guide for guiding the boat elevator 31. Thus, the load means 30 is adapted to load the wafer boat 20 with wafers W into the treatment unit 10.

Figure 2:
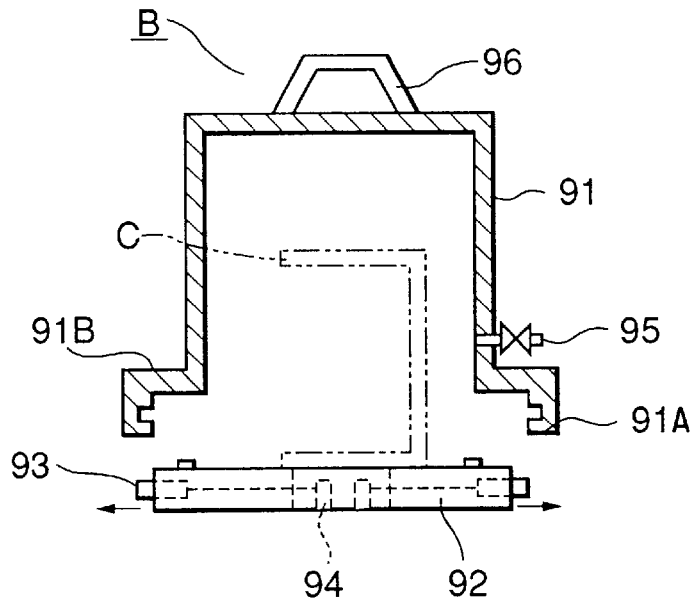
FIG. 2 is a schematic sectional view, showing the structure of a container B in the first embodiment of the present invention.

The container B and the carrier C will now be described. As is shown in FIG. 2, the container B comprises a container main body 91 and a container bottom member 92. The container main body 91 has a size sufficient to contain the carrier C, and has a lower open end and a lower stepped portion. Further, the container main body 91 has a flange 91A at the lower open end. The flange 91A is placed on a mount stage 51 with a seal member (such as an O ring) interposed therebetween, thereby airtightly closing an insertion hole 52 (which will be described later). The container main body 91 also has a flange 91B at the stepped portion. The flange 91B is attached to a container bottom member 92 with a seal member such as an O ring interposed therebetween, thereby airtightly sealing the container B.

Lock pins 93 are provided at predetermined peripheral portions of the container bottom member 92 such that they can project from and retreat into the bottom member 92. A rotary link mechanism 94 linked with the lock pins 93 is provided at a center portion of the container bottom member 92. The container main body 91 can be attached to and detached from the container bottom member 92 by rotating the rotary link mechanism 94.

Gas introducing means 95 with a valve is provided through a side wall portion of the container main body 91 for introducing an inactive gas into the container B. With this structure, a very clean inactive gas is introduced into the container B with the carrier C held therein. The container B has a handle 96 provided on an upper surface of the container main body 91. The container B is carried with the handle 96 grasped.

The carrier C is a rectangular shaped member having front and rear open ends. A plurality (e.g. 13) of support projections for supporting edge portions of a plurality (e.g. 13) of wafers W are provided on the inner surfaces of opposite sides at regular intervals in the vertical direction. Thus, the carrier C can contain thirteen wafers W at regular intervals in the vertical direction such that each wafer is kept horizontal, and permits the fork 101 (which will be described later) to horizontally enter it through the front open end so as to transfer the wafers W between the fork 101 and the support projections.

Figure 3:
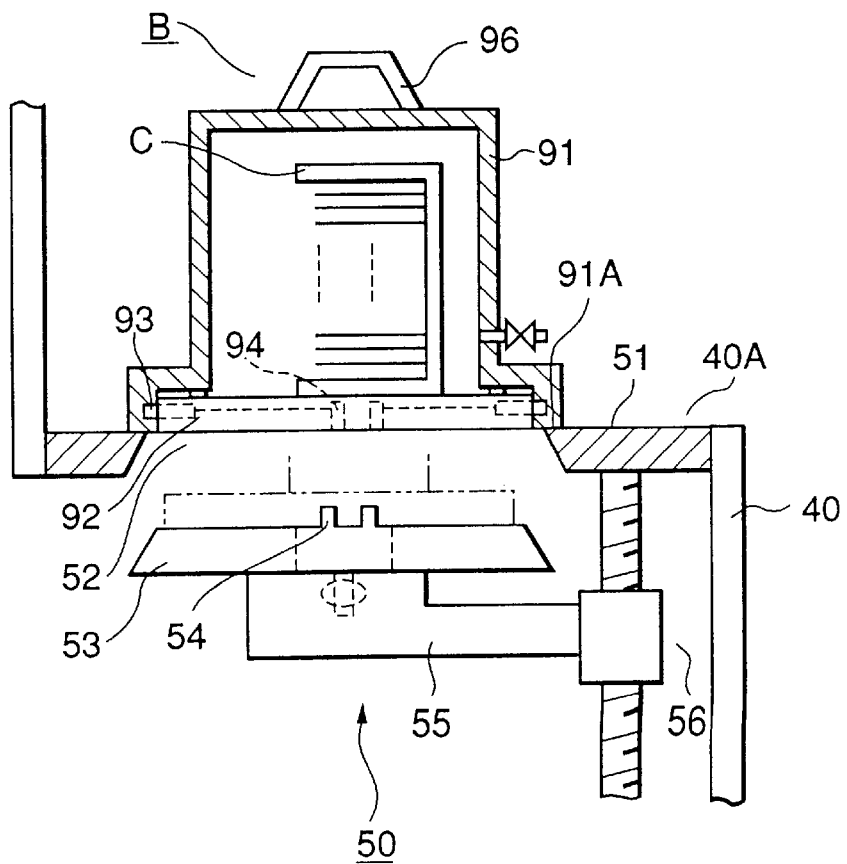
FIG. 3 is a schematic sectional view, showing take-in means in the first embodiment of the present invention.

As is shown in FIG. 3, the take-in mechanism 50 includes the mount stage 51 forming a ceiling portion 40A of the load chamber 40, and a container bottom mount stage 53 adapted to airtightly seal an insert hole 52 formed in the stage 51 and to mount thereon the container bottom member 92. The insert hole 52 has a smaller diameter than the inner diameter of the flange 91A of the container main body 91 of the container B such that the hole 52 is airtightly sealed with the flange 91A, with a seal member interposed therebetween. Further, the insert hole 52 has a larger diameter than the outer diameter of the container bottom member 92 such that it permits the member 92 to be inserted therethrough. The container bottom mount stage 53 has its periphery tapered upward, and is disposed to be attached to the lower surface of the stage 51 to airtightly seal the insert hole 52. Rotary pins 54 to be engaged with the rotary link mechanism 94 of the container B are provided on center portions of the container bottom mount stage 53. Rotation of the rotary pins 54 operates the rotary link mechanism 94 so as to make the lock pins 93 project or retreat. The take-in mechanism 50 further includes a vertically movable stage 55 which mounts thereon the container bottom mount stage 53, and a ball screw mechanism 56 for vertically moving the vertically movable stage 55. Where the container main body 91 is placed on the mount stage 51, the container bottom member 92 with the carrier C is guided into the load chamber 40 by vertically moving the vertically movable stage 55. Thus, the container B is connected with the load chamber 40 so as to not expose the wafers W contained and carried by the carrier C to the outside air. Then, the carrier C is contained in a wafer transfer space 41 in which the wafer W can be transferred by a transfer mean 60 described below.

In the load chamber 40, the transfer means is contained. The transfer means 60 includes an arm section 100 as load/unload means for loading wafers W into the carrier C and the wafer boat 20 and unloading wafers W from them, and driving means 110 for moving the arm section 100 between a first position in which wafers W can be carried out of and into the carrier C, and a second position in which wafers W can be carried out of and into the wafer boat 20.

Figure 4:
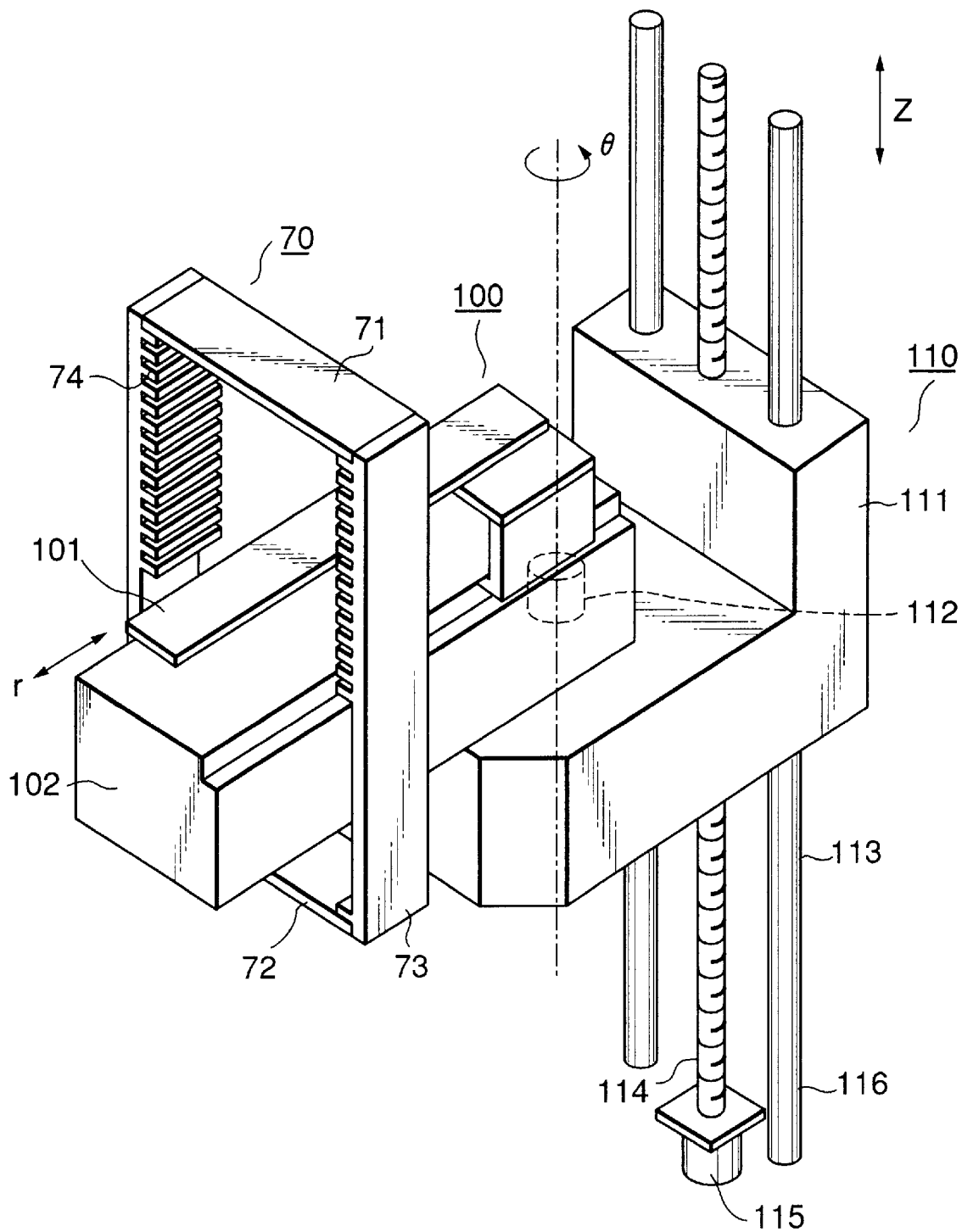
FIG. 4 is a perspective view, showing transfer means in the first embodiment of the present invention.
Figure 5:
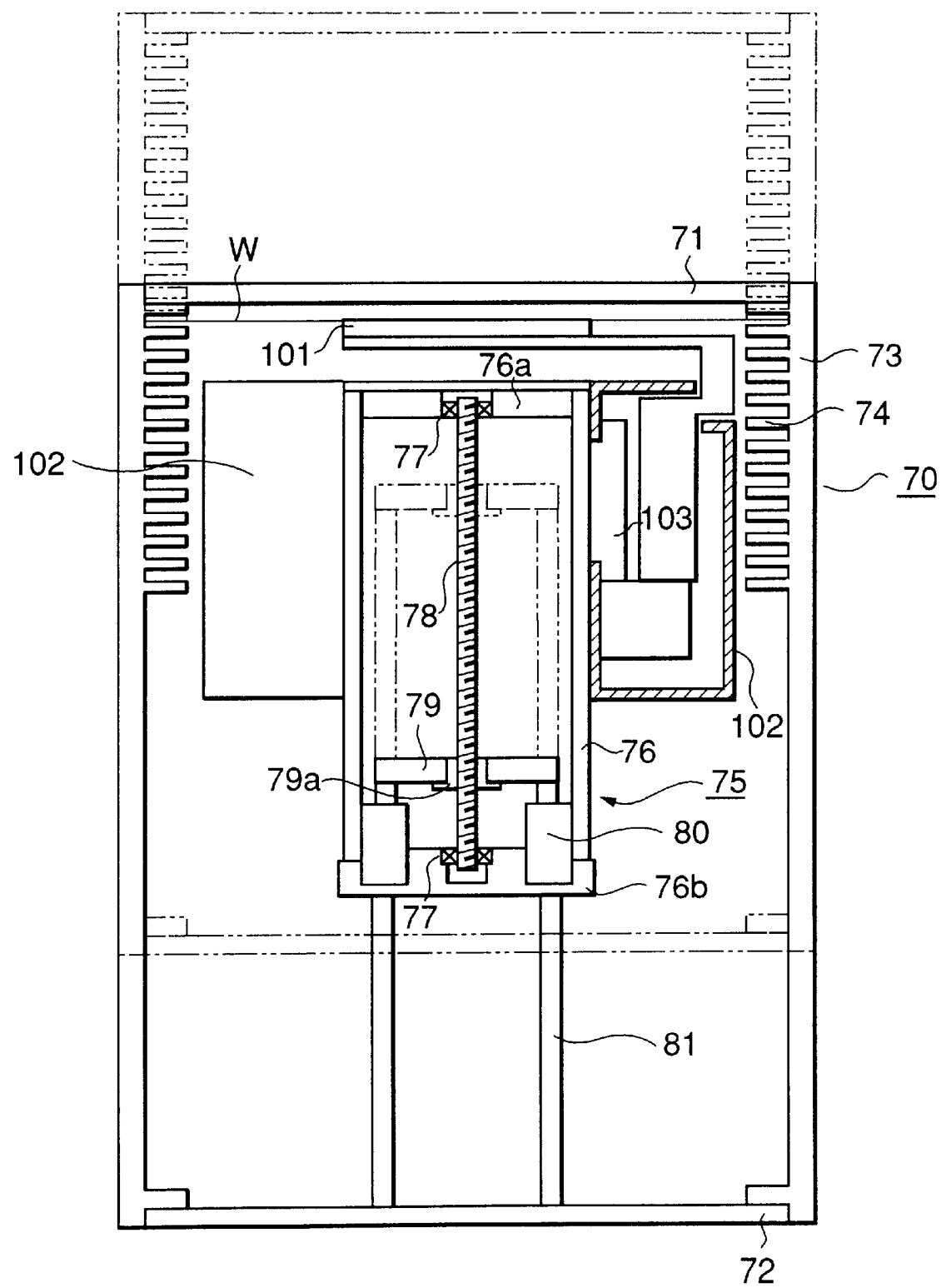
FIG. 5 is a schematic sectional view, showing load/unload means and a third support member incorporated in the first embodiment of the present invention.

As is shown in FIG. 4, the arm section 100 includes a holding member for holding each wafer W, for example, the fork 101 for mounting thereon each wafer W, and an arm main body 102 supporting the fork 101. The arm main body 102 contains therein driving means such as a linear motor 103 as shown in FIG. 5. The fork 101 is driven by the linear motor 103 in a direction in which it advances and retreats relative to the arm main body 102, i.e. in a direction indicated by arrow r in FIG. 4.

The driving means 110 includes a support stage 111 which supports the arm section 100 such that it can rotate in a direction θ, rotating means such as a direct motor 112 for rotating the arm section 100 in the direction θ, and a driving mechanism such as a ball screw mechanism 113 for moving the support stage 111 vertically, i.e. in a direction indicated by arrow Z in FIG. 4. The ball screw mechanism 113 has a ball screw 114 to be engaged with a nut fixed to the support stage 111, rotating means such as a motor 115 for rotating the ball screw 114, and a linear guide 116 for guiding the support stage 111. Rotating the ball screw 114 by the motor 115 causes vertical moving of the support stage 111 to be vertically guided by the linear guide 116, thereby vertically moving the arm section 100 supported by the support stage 111. As described above, the driving means 110 is adapted to move the arm section 100 in the direction θ or Z. The arm section 100 moves between the first and second positions in accordance with its Z- and θ-directional movements.

The transfer means 60 is adapted to transfer, in a desired position, each wafer W between the carrier C and the wafer boat 20 in accordance with Z- and θ-directional movements of the arm section 100 and r-directional movement of the fork 101.

As is shown in FIGS. 4 and 5, the temporally mounting stage 70 includes an upper end plate 71, a lower end plate 72, and a pair of support plates 73 opposed to each other and connecting the end plates 71 and 72. Each support plate 73 has an inner surface provided with a plurality (e.g. 13) of support projections 74, which are arranged at regular intervals in the vertical direction for supporting edge portions of wafers W. Each support projection 74 is convex shaped. Thus, the temporally mounting stage 70 can support a plurality of wafers W at regular intervals in the vertical direction such that each wafer is kept horizontal. Moreover, the temporally mounting stage 70 is supported by the arm main body 102, and moves in accordance with the Z- and θ-directional movements of the arm section 100. The temporally mounting stage 70 is also moved vertical relative to the arm main body 102 by a vertically driving mechanism which will be described later.

As is shown in FIG. 5, the vertically driving mechanism of the temporally mounting stage 70, e.g. the ball screw mechanism 75, is constructed as below. A driving mechanism chamber 76 whose shape is for example a rectangular parallelepiped is secured to the arm main body 102. A ball screw 78 is rotatably secured to upper and lower end portions of the driving mechanism chamber 76 via bearing means 77.

A mobile member 79 is provided in the driving mechanism chamber 76. The mobile member 79 has its nut 79a screwed on the ball screw 78 such that it is vertically moved in accordance with rotation of the ball screw 78. The mobile member 79 is coupled with the lower end plate 72 of the temporally mounting stage 70 by means of connecting members 81. The connecting members 81 extend through guide members 80 fixed to the driving mechanism chamber 76. Driving means consisting of, for example, a combination of a motor, a pulley and a belt (not shown) is provided in the chamber 76 for rotating the ball screw 78. Vertical movement of the mobile member 79 caused by the rotation of the ball screw 78 vertically moves the temporally mounting stage 70 with respect to the arm main body 102. Vertical movement of the temporally mounting stage 70 and r-directional movement of the fork 101 enable the transfer of wafers W between the support projections 74 of the stage 70 and the fork 101.

Figure 6:
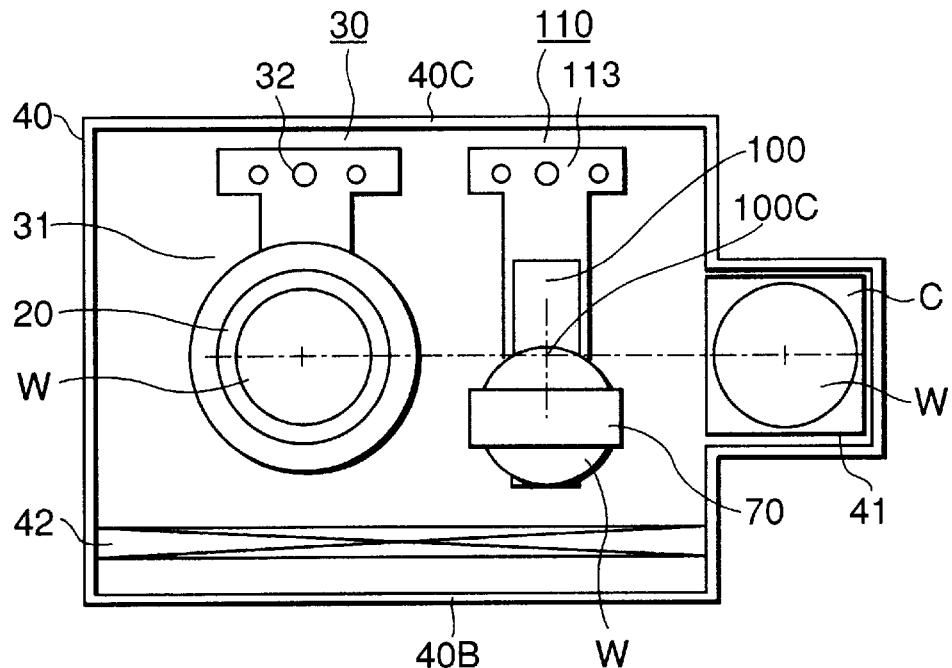
FIG. 6 is a schematic plan view, showing a horizontal arrangement of the first embodiment of the present invention.

FIG. 6 shows a horizontal arrangement of the elements contained in the load chamber 40. The carrier C placed in the wafer transfer space 41 and the wafer boat 20 placed on the boat elevator 31 are arranged in positions in which each wafer W can be transferred therebetween by means of the transfer means 60. For example, the carrier C and the wafer boat 20 are positioned such that the distance between the center of each wafer W contained in the carrier C and the center-of-rotation 100c of the arm section 100 is equal to the distance between the center of each wafer W contained in the wafer boat 20 and the center-of-rotation 100c. Further, the carrier C is opposed to the wafer boat 20 placed on the load means 30 with respect to the transfer means 60. A filter 42 is provided in the load chamber 40 close to one 40B of the side walls of the chamber 40. An inactive gas is introduced through the filter 42 into the load chamber 40 by the inactive gas introducing means. This means that a very clean inactive gas is introduced into the load chamber 40. The ball screw mechanism 32 of the load means 30 and the ball screw mechanism 113 of the driving means 110 are arranged close to the other 40C of the side walls of the load chamber 40. The inactive gas is controlled so as to flow in the load chamber 40 from the side 40B to the side 40C in order to suppress the amount of contamination of the wafers W due to particles generated from the ball screw mechanisms 32 and 113 of the load means 30 and the driving means 110.

The operation of the heat treatment apparatus 1 according to the embodiment will be described. First, the carrier C contained in the container B and carrying non-treated wafers W is introduced into the load chamber 40. Specifically, an automatic guided vehicle (hereinafter referred to as "AGV") or an operator reaches the load chamber 40, the container B containing the carrier C with a plurality (e.g. 13) of wafers W is placed, on the mount stage 51 with the AGV or the operator. At this time, the container bottom mount stage 53 is situated in an upper limit position, and the rotary pins 54 are engaged with the rotary link mechanism 94. Subsequently, the lock pins 93 are retreated by rotating the rotary pins 54 and operating the rotary link mechanism 94, thereby detaching the container bottom member 92 from the container main body 91. Then, the vertically movable arm 55 is lowered, thereby making the container B communicate with the load chamber 40, and carrying the container bottom member 92 and the carrier C with non-treated wafers W into the load chamber 40. Thus, the carrier C is transferred into the wafer transfer space 41 without exposing the wafers W to the outside air.

Thereafter, the arm section 100 is moved vertical to position the fork 101 at a level corresponding to the level of a to-be-contained target wafer W contained in the carrier C situated in the wafer transfer space 41. The arm section 100 is also rotated in the direction θ to assume the first position in which the target wafer W can be transferred from the carrier C, e.g. in a position in which the center of the front surface of the carrier C exists on the line of an advance direction of the fork 101.

Then, the fork 101 is advanced and located just below the target wafer W. The fork 101 is slightly raised to place the wafer thereon, and then retreated to unload the target wafer W from the carrier C. Subsequently, the temporally mounting stage 70 is vertically moved relative to the arm main body 102, thereby positioning that one of the support projections 74 on which the target wafer W is to be placed, at a level slightly lower than the fork 101. The fork 101 is then retreated to horizontally align the support projection 74 with an edge portion of the target wafer W. The temporally mounting stage 70 is slightly raised relative to the arm main body 102, thereby placing and supporting the target wafer W on the support projection 74. In a manner similar to the above, the next target wafer W is carried out of the carrier C, placed on a corresponding one of the support projections 74. Thus, the above-described series of operations is repeated to transfer the next target wafer W to the temporally mounting stage 70. The wafers W are successively placed on the support projections 74 of the stage 70 usually in the order beginning from the uppermost one.

Thereafter, the operation of exchanging the carrier C with a new one to be situated in the wafer transfer space 41 is performed parallel to the operation of transferring the wafers W supported by the temporally mounting stage 70 to the wafer boat 20.

The exchange of the carrier C with a new one is performed in the following manner.

An operation reverse to the above-described transfer operation of the carrier C is performed, thereby putting the carrier C with no wafers into the container B placed on the mount stage 51 and disconnecting the container B from the load chamber 40. Subsequently, the container B containing the carrier C with no wafers W is moved from the mount stage 51 by the AGV or the operator, and then a new carrier C with wafers W to be treated is mounted on the mount stage 51. This carrier C with the wafers W to be treated is transferred into the wafer transfer space 41 by the above-described carrier take-in operation.

On the other hand, the operation of transferring each wafer W contained and supported in the temporally mounting stage 70 from it to the wafer boat 20 is performed in the following manner.

The arm section 100 is vertically moved with a plurality of wafers W supported by the temporally mounting stage 70, thereby positioning the fork 101 at a level corresponding to the level of that one of the support projections 24 of the wafer boat 20 on which a target wafer W is to be placed, and rotating the arm section 100 in the direction θ to situate it in the second position in which the wafer W can be transferred from the fork 101 to the wafer boat 20, for example, in which the center of the front surface of the wafer boat 20 exists on the line of an advance direction of the fork 101.

Thereafter, the temporally mounting stage 70 is moved vertical with respect to the arm section 100, thereby positioning the support projection 74 with the to-be-transferred wafer W placed thereon, at a level slightly lower than the level of the fork 101, and placing the wafer W on the fork 101. Then, the fork 101 with the wafer W is advanced into the wafer boat 20 and slightly lowered, thereby placing the wafer W on the support projection 24. The fork 101 is then retreated from the wafer boat 20. Thereafter, similar operations are executed to transfer the next wafer W. The above-described series of operations is thus repeated to transfer to the wafer boat 20 all wafers W supported by the temporally mounting stage 70.

If exchange of carriers C is not completed at the time when transfer of a wafer W from the temporally mounting stage 70 to the wafer boat 20 has been finished, the operation of the transfer means 60 is stopped until the exchange is completed. After the exchange is completed, target wafers W to be transferred next and contained in a new carrier C situated in the wafer transfer space 41 are transferred into the wafer boat 20 in the same manner as above.

When a predetermined number (e.g. 150) of wafers W have been contained in the wafer boat 20 after the transfer of each wafer from the carrier C situated in the wafer transfer space 41 to the wafer boat 20 is repeated, the boat elevator 31 is raised to load the wafer boat 20 with the wafers W into the treatment container 11. Then, the lower open end of the manifold 14 is airtightly closed with the lid member 26.

Subsequently, the wafers W contained in the wafer boat 20 in the treatment container 11 are heated to a predetermined temperature by the heater 12, and then subjected to a predetermined heat treatment using a treatment gas introduced therein through treatment gas introducing means. After the heat treatment is performed for a predetermined period of time, heating of the wafers W and introduction of the treatment gas are stopped. After the heat treatment, the heat-treated wafers W are transferred from the wafer boat 20 to the carrier C situated in the wafer transfer space 41 in a manner reverse to the case of the transfer from the carrier C to the wafer boat 20.

According to the present embodiment, a plurality of wafers W supported by the carrier C are transferred to the temporally mounting stage 70, and the arm section 100 is moved between the first and second positions, with the wafers W supported by the stage 70. Therefore, the number of times of transfer of the arm section 100 between the first and second positions is decreased, thereby also decreasing the time required for transfer of all the wafers W from the carrier C to the wafer boat 20 and hence increasing the throughput of the treatment apparatus. Moreover, the assignability of use of the carrier C and the container B can be increased since only a short time is required to carry all wafers W from the carrier C.

A greater part of the time required to transfer wafers W between the carrier C and the wafer boat 20 is constituted of the time required for the Z- and θ-directional movements of the arm section 100. Therefore, to move the arm section 10 in the Z- and θ-directions at a time, with a plurality of wafers W supported by the temporally mounting stage 70, significantly contributes to shortening of the time required for the transfer of the wafers W.

It is preferable that the temporally mounting stage 70 can support the same number of wafers W as the carrier C or a greater number of wafers W than the carrier C. In the preferable case, the arm section 100 can be shifted to the operation of transferring the wafers W to the wafer boat 20 after all the wafers W are transferred from the carrier C to the temporally mounting stage 70. This means that the carrier C does not contain remaining wafers W and hence need not wait for the arm section 100 to transfer such remaining wafers. Therefore, the treatment apparatus has a high efficiency.

Figure 7:
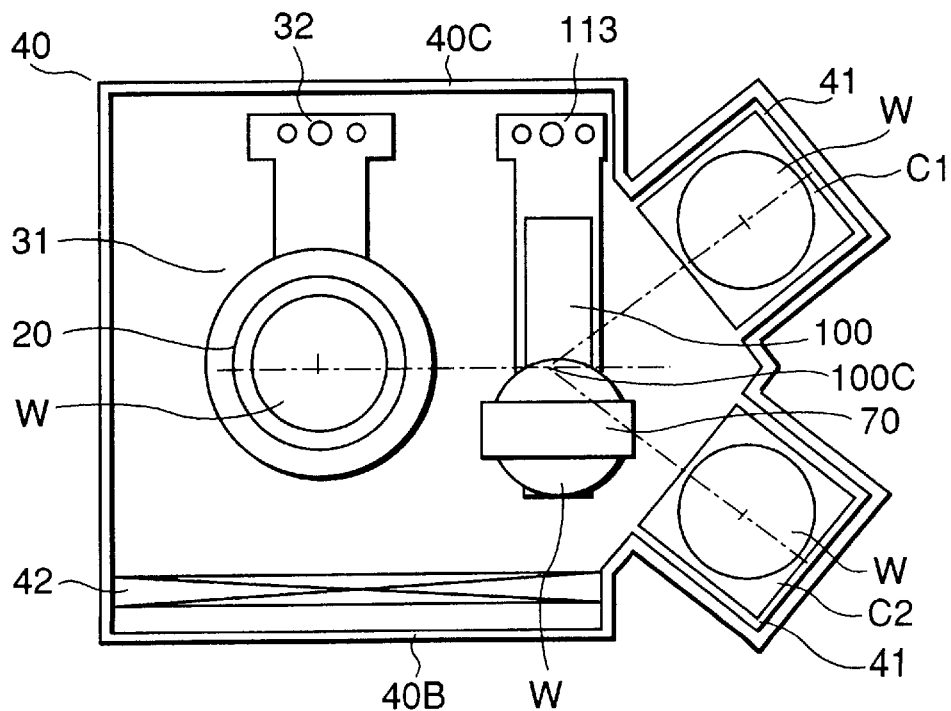
FIG. 7 is a schematic plan view, showing a horizontal arrangement of a modification of the first embodiment of the present invention.

The invention may be modified such that the load chamber 40 includes a plurality of wafer transfer spaces 41, and a plurality of carriers C are situated in the spaces, respectively. For example, in the case of employing two wafer transfer spaces 41, the treatment apparatus is constructed as shown in FIG. 7. In the FIG. 7 case, a carrier C1 and a carrier C2 situated in the two wafer transfer spaces 41 and the wafer boat 20 placed on the boat elevator 31 are all situated in positions in which each wafer W can be transferred by means of the transfer means 60, for example, in which the distance between the center of each wafer W contained in each of the carriers C1 and C2 and the center-of-rotation 100c of the arm section 100 is equal to the distance between the center of each wafer W contained in the wafer boat 20 on the boat elevator 31 and the center-of-rotation 100c. In the thus constructed apparatus, it is preferable to alternately perform the transfer of a wafer W from the carrier C1 situated in one of the wafer transfer spaces 41 to the wafer boat 20, and the transfer of a wafer W from the carrier C2 situated in the other of the wafer transfer spaces 41 to the wafer boat 20, in the case of performing the operation of transferring the wafer W from the carrier C into the wafer boat 20. Since in this case, transfer of all wafers from the carrier C (C1, C2) to the wafer boat 20 is performed twice while exchange of carriers C is performed once, the time for which the transfer means 60 is stopped can be shortened even where the time required for the carrier exchange is longer than the time required for the transfer of a wafer from the carrier C to the wafer boat 20. As a result, the throughput of the treatment apparatus can be enhanced.

Figure 8:
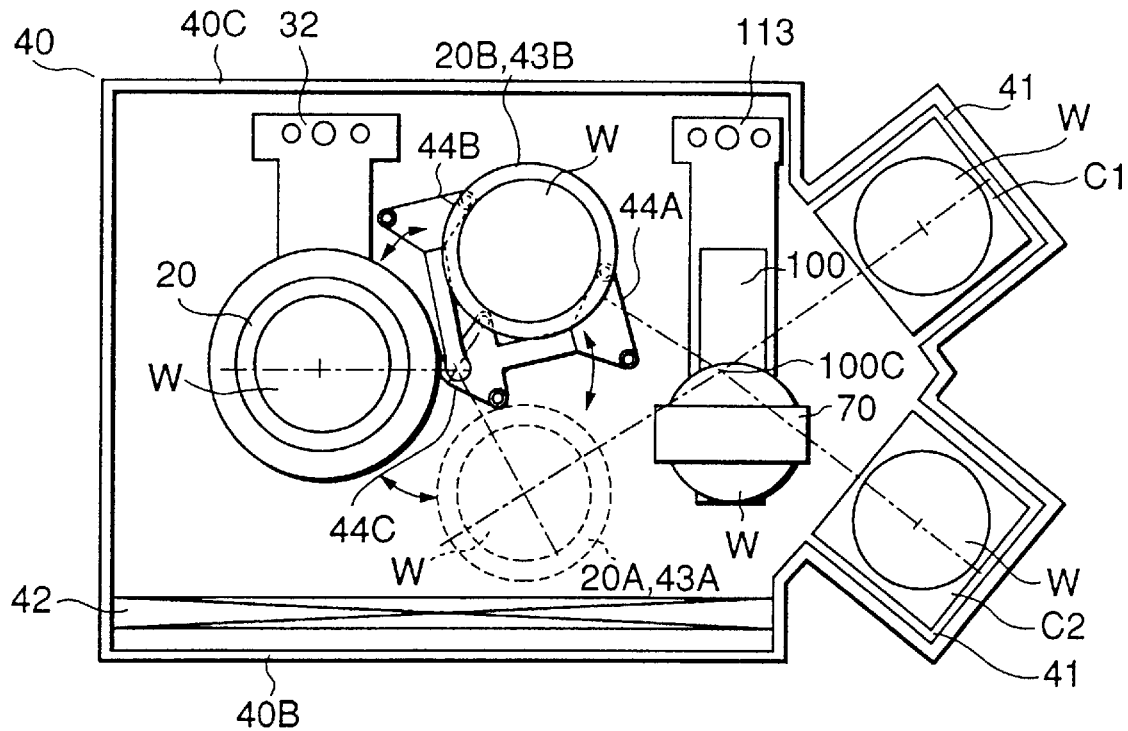
FIG. 8 is a schematic plan view, showing a horizontal arrangement of another modification of the first embodiment of the present invention.

Alternatively, the treatment apparatus may be modified as shown in FIG. 8. In this case, the load chamber 40 contains a boat mount member 43A for mounting thereon a wafer boat 20A with non-treated wafers W before the heat treatment, and a boat mount member 43B for mounting thereon a wafer boat 20B with heated wafers W. Further, boat transfer means 44 for transferring the wafer boat 20 is located between the temperature retaining cylinder 25 on the boat elevator 31 and the boat mount member 43A, and between the temperature retaining cylinder 25 and the boat mount member 43B.

The boat transfer means 44 is coupled with an angularly and vertically driving unit attached to the lower outer surface of the load chamber 40, and with the transmission shaft of the driving unit located in the load chamber 40, and comprises a first boat holding arm 44A and a second boat holding arm 44B for holding the wafer boat 20.

Figure 9:
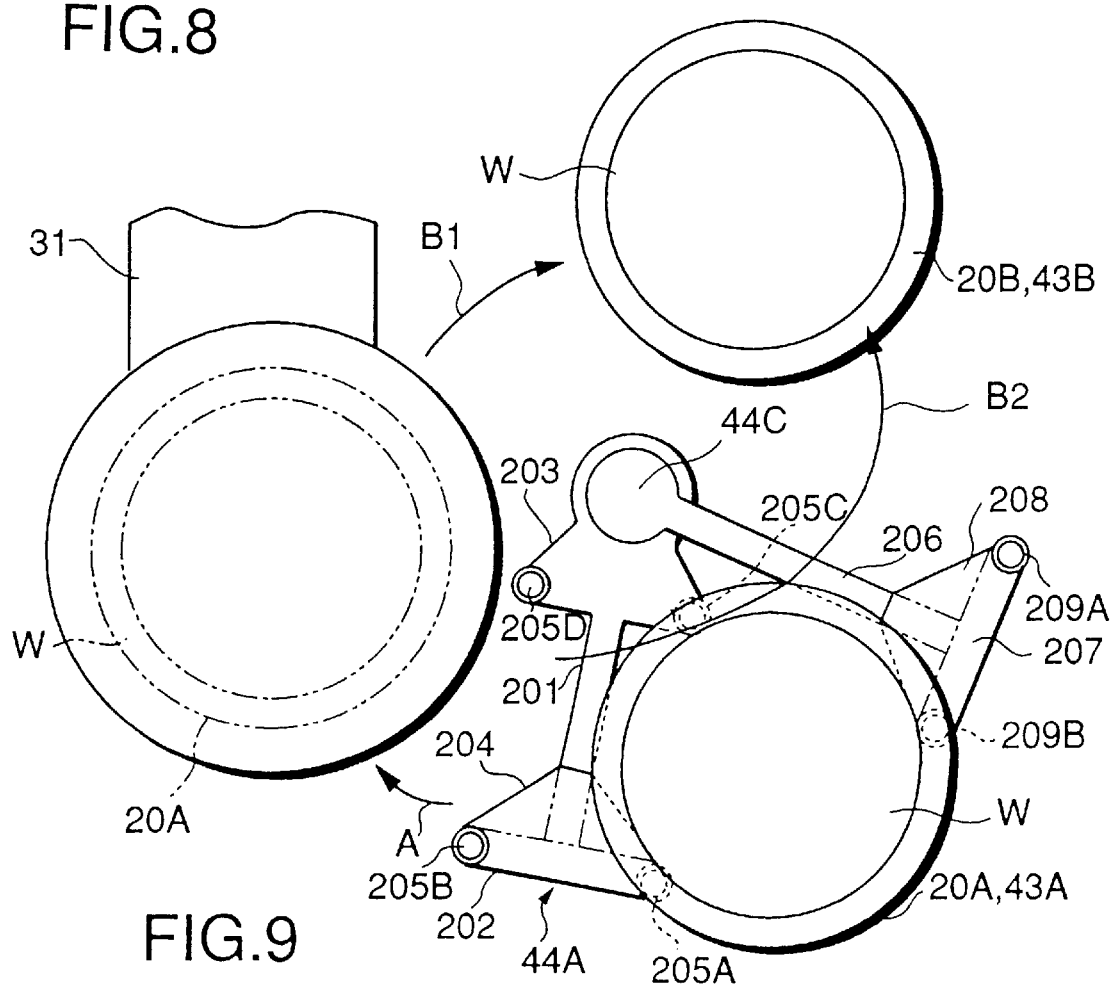
FIG. 9 is a schematic plan view, showing first and second boat holding arms employed in the modification of FIG. 8 for transferring a wafer boat employed in the same.

As is shown in FIG. 9, the first boat holding arm 44A comprises a first rod 201 coupled with the transmission shaft of the driving unit, a substantially T-shaped second rod 202 attached to an end of the first rod 201, and a substantially triangular support plate 203 attached to the portion of the first rod 201 which is located in the vicinity of the transmission shaft. Further, a substantially triangular reinforcing plate 204 is attached to the first rod 201 such that it covers a tip portion of the first rod 201 and the second rod 202. Boat support pins 205A–205D are attached to those corner portions of the reinforcing plate 204 which superpose opposite end portions of the second rod 202, and also to corner portions of the support plate 203, respectively.

On the other hand, the second boat holding arm 44B comprises a first rod 206 coupled with the transmission shaft of the driving unit, and a substantially T-shaped second rod 207 attached to an end of the first rod 206. A substantially triangular reinforcing plate 208 is attached to a tip portion of the first rod 206 and the second rod 207. Boat support pins 209 are attached to those corner portions of the reinforcing plate 208 which superpose opposite end portions of the second rod 207, respectively.

Figure 10:
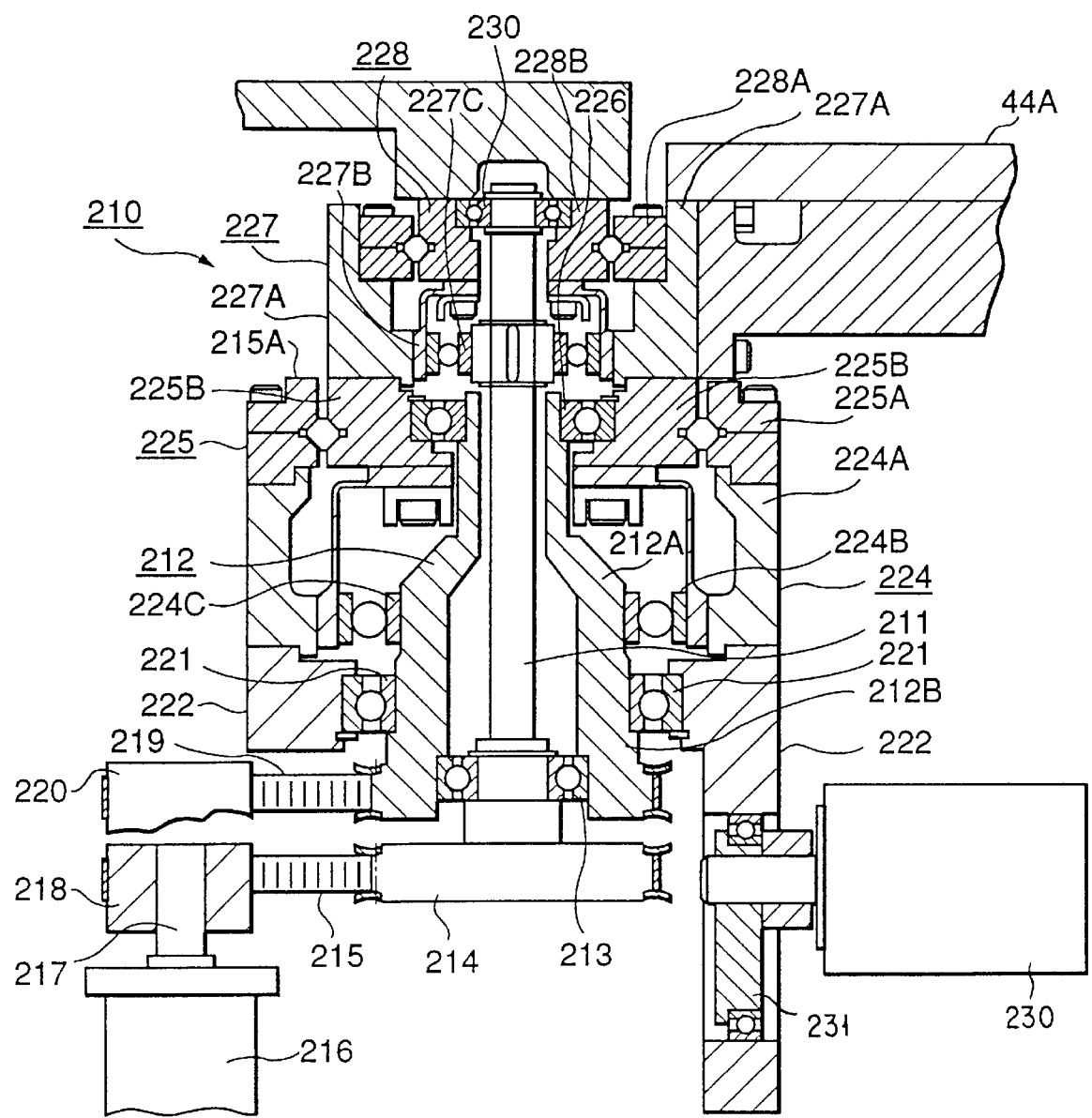
FIG. 10 is a longitudinal sectional view, showing a mechanism for driving the first and second boat holding arms employed in the modification of FIG. 8.

The first and second boat holding arms 44A and 44B can individually rotate about the center-of-rotation 44C in opposite directions. FIG. 10 shows an example of a driving unit for driving the first and second holding arms 44A and 44B.

The driving unit 210 comprises a substantially rod-shaped first driving shaft 211, and a substantially cylindrical second driving shaft 212 which surrounds the first driving shaft 211. A ball bearing 213 is provided between lower portions of the first and second driving shafts 211 and 212. The second driving shaft 212 has an upper small-diameter portion 211A and a lower large-diameter portion 212B.

A pulley 214 is secured to the lower end of the first driving shaft 211, and coupled, by means of a belt 215, with a pulley 218 connected to a shaft 217 of a first motor 216. Similarly, the lower end of the large-diameter portion 212B of the second driving shaft 212 is coupled, by means of a belt 219, with a pulley 220 connected to the shaft of a second motor. Thus, the first and second driving shafts 211 and 212 can be rotated independent of each other by the first motor 216 and the second motor, respectively.

A driving unit main body 223 is provided around the outer periphery of the large-diameter portion 212B of the second driving shaft 212 with a ball bearing 222 interposed therebetween. The driving unit main body 223 can be moved by a linear guide (not shown) in a Z-axis direction.

A first harmonic drive (hereinafter referred to as "H/D") 224 serving as a reduction gear is attached to the upper surface of the driving unit main body 223. An outermost circular spline 224A incoroprated in the first H/D is secured to the driving unit main body 223. An innermost web generator 224C incorporated in the first H/D 224 is secured to the second driving shaft 212.

A first cross roller bearing 225 is provided on the upper surface of the first H/D 224. The first cross roller bearing 225 has an outer wheel 225A secured to the circular spline 224A of the first H/D 224, and an inner wheel 225B secured to a flex spline 224B of the first H/D 224. A ball bearing 226 is interposed between the inner wheel 225B and the small-diameter portion 212A of the second driving shaft 212. When the first driving shaft 211 rotates, the flex spline 224B located between the circular spline 224A and the web generator 224C moves in a direction opposite to the rotational direction of the first driving shaft 211 at a lower speed than the first driving shaft 211.

A second H/D 227 is successinaly provided on the upper surface of the inner wheel 225B of the first cross roller bearing 225. The outermost circular spline 227A of the second H/D 227 is fixed to the inner wheel 225B of the first cross roller bearing 225. The innermost web generator 227C of the second H/D 227 is fixed to the second driving shaft 212. When the second driving shaft 212 rotates, a flex spline 227B located between the circular spline 227A and the web generator 227C rotates in a direction opposite to the second driving shaft 212 at a lower speed than the same.

A second cross roller bearing 228 is provided on an upper portion of the circular spline 227A of the second H/D 227. The outer wheel 228A of the second cross roller bearing 228 is fixed to the circular spline 227A of the second H/D 227, and the inner wheel 228B of the same is fixed to the flex spline 227B of the second H/D 227. A ball bearing 229 is interposed between the inner wheel 228B of the second cross roller bearing 228 and an upper end portion of the first driving shaft 211.

The circular spline 227A of the second H/D 227 is connected to the first boat holding arm 44A. On the other hand, the inner wheel 228B of the second cross roller bearing 228 is fixed to the second boat holding arm 44B.

The driving main body 222 is provided with a vertically driving motor 231 having an eccentric ring 230 with a vertical stroke of about 20 mm and serving as a mechanism for vertically moving the first and second boat holding arms 44A and 44B.

The driving unit 210 is constructed such that the first and second boat holding arms 44A and 44B are independently rotated by the first motor 216 and the second motor, respectively, and such that the first and second boat holding arms 44A and 44B are moved vertically and simultaneously by the vertical driving motor 231.

The temperature retaining cylinder 25, the boat mount member 43A and the boat mount member 43B provided on the boat elevator 31 are all situated in positions in which the wafer boat 20 can be transferred by the boat transfer means 44, for example, in which the distance between the boat mount member 43A and the center-of-rotation 44c of the boat holding arms 44A and 44B is equal to the distance between the boat mount member 43B and the center-of-rotation 44c. Further, to restrain contamination of a non-treated wafer W with particles generated from a treated wafer W, the boat mount member 43A is located upstream of the boat mount member 43B with respect to the flow of clean air.

It is preferable to operate, in the following manner, the treatment apparatus constructed as above.

Suppose that at a certain time of point, the wafer boat 20A with non-treated wafers W before the heat treatment is mounted on the boat mount member 43A, and the wafer boat B with heat treated wafers W on the boat mount member 43B, as is shown in FIG. 9. The wafer boat 20A is then transferred onto the temperature retaining cylinder 25 on the boat elevator 31, and loaded into the treatment unit 10. In the treatment unit, the boat 20A is heated. While the boat 20A is being heated, the treated wafers W are transferred from the boat mount member 43B to the carrier C situated in the wafer transfer space 41. After all treated wafers W are transferred from the boat mount member 43B to the carrier, the vacant wafer boat 20 is transferred from the boat mount member 43B to the boat mount member 43A, thereby transferring a predetermined number of non-treated wafers W from the carrier C situated in the wafer transfer space 41 to the wafer boat 20 placed on the boat mount member 43A. After the heat treatment is finished, the wafer boat 20B with treated wafers W is unloaded from the treatment unit 10. Thereafter, the wafer boat 20B is transferred to the boat mount member 43B. The above-described operations are repeated. As a result, the time required until the next heat treatment is started after the heat treatment in the treatment unit 10 is finished can be shortened, thereby increasing the throughput of the treatment apparatus.

The movement of the wafer boat 20 by the first and second boat holding arms 44A and 44B will be described in more detail. First, as shown in FIG. 9, the first and second holding arms 44A and 44B are rotated in opposite directions and positioned such that they hold the wafer boat 20A on the boat mount member 43A from opposite sides. At this time, the first and second boat holding arms 44A and 44B are situated at a slightly lower level than the lower end plate 22 of the wafer boat 20A.

Subsequently, the first and second holding arms 44A and 44B are slightly raised (e.g. by about 20 mm) by driving the vertically driving motor 231. As a result, the wafer boat 20A is held between the first and second boat holding arms 44A and 44B. At this time, the boat support pin 205A at an end of the second rod 202 of the first boat holding arm 44A, the boat support pin 205C at en end of the support plate 203 and the boat support pin 209B at an end of the second rod 207 of the second boat holding arm 44B support three edge portions of the wafer boat 20A at substantially regular intervals.

Thereafter, the first and second boat holding arms 44A and 44B are simultaneously moved in a direction indicated by arrow A in FIG. 9, stopped above the temperature retaining cylinder 25 on the boat elevator 31, and lowered by driving the vertically driving motor 231, thereby placing the wafer boat 20A on the temperature retaining cylinder 25.

After finishing the transfer of the wafer boat 20A, the first and second boat holding arms 44A and 44B are rotated in opposite directions indicated by arrows B1 and B2 in FIG. 9, and positioned such that they can hold the wafer boat 20B from opposite sides. Thereafter, the wafer boat 20B placed on the boat mount member 43B, out of which treated wafers W are all carried, is transferred onto the boat mount member 43A in the same manner as above. At this time, the remaining boat support pins 205B and 205D of the first boat holding arm 44A and the boat support pin 209A of the second boat holding arm 44B support three points of the wafer boat 20B.

U.S. Pat. No. 4,770,590 discloses a technique as described above. In the case of a semiconductor manufacturing apparatus installed in a factory with high floor cost, a reduction in footprint, i.e. the area of the apparatus, is always required. Also in light of this, the treatment apparatus shown in FIG. 8, which is compact, is suitable. Moreover, in the treatment apparatus of FIG. 8, only one boat is held by the first and second boat holding arms 44A and 44B while the arms rotate. Therefore, as compared with the apparatus disclosed in U.S. Pat. No. 4,770,590, the load applied to the rotating first and second boat holding arms 44A and 44B is light, and the holding means including the first and second boat holding arms 44A and 44B is stable against the centrifugal force.

A longitudinal heat treatment apparatus according to a second embodiment of the invention will now be described.

Figure 11:
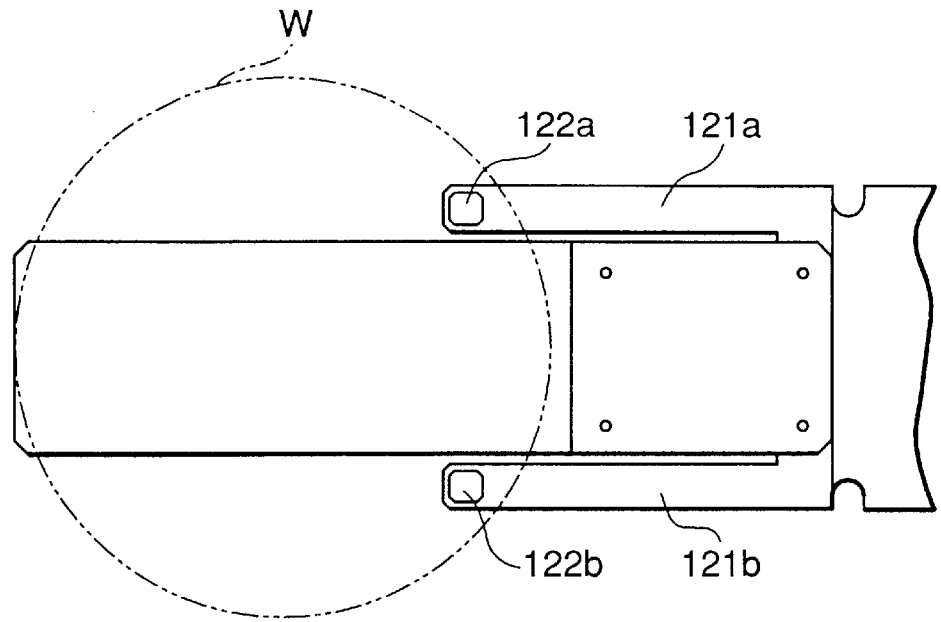
FIG. 11 is a graphical view position detecting means employed in a second embodiment of the present invention.
Figure 12:
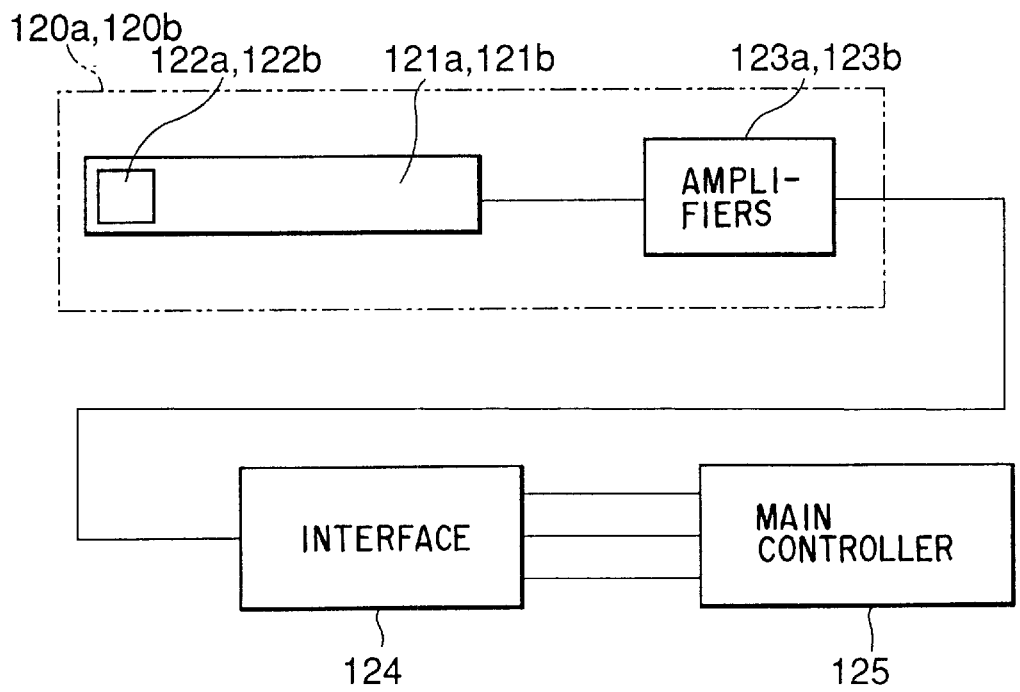
FIG. 12 is a graphical view of the position detecting means employed in the second embodiment of the present invention.

As is shown in FIGS. 11 and 12, position detecting means, such as electrostatic capacitance sensors 120a and 120b, for detecting the positional relationship between the fork 101 and the wafer W are provided close to opposite side portions of the fork 101, respectively. The electrostatic capacitance detecting sensors 120a and 120b respectively comprise sensor heads 121a and 121b provided on opposite side portions of the fork 101, sensors 122a and 122b provided at tip portions of the sensor heads 121a and 121b, and amplifiers 123a and 123b connected to the sensor heads 121a and 121b. The sensors 120a and 120b are formed as non-contact sensors. The electrostatic capacitance sensors 120a and 120b measure the electrostatic capacitance between the sensor 122a and the wafer W and between the sensor 122b and the wafer W, respectively. Since the electrostatic capacitance between the wafer W and the sensor 122a or 122b depends upon the positional relationship between the wafer W and the sensor 122a or 122b, i.e. upon the vertical and/or horizontal distance therebetween, the positional relationship therebetween can be detected by measuring the electrostatic capacitance therebetween. This means that the positional relationship between the fork 101 and the wafer W can be detected.

A signal indicative of the distance between the wafer W and the sensor 122a or 122b which corresponds to the electrostatic capacitance measured by the electrostatic capacitance sensor 120a or 120b is output from the amplifier 123a or 123b and input to an interface 124. In the interface 124, the signal output from the amplifier 123a or 123b and indicative of the distance between the wafer W and the sensor 122a or 122b is interpreted on the basis of a predetermined value or a reference value supplied from a main controller 125. The interface 124 then supplies the main controller 125 with information as to whether or not there is a wafer W or whether or not the wafer W is separated from the fork 101 by an appropriate distance. The main controller 125 in turn outputs a control signal based on the input information, to each driving element of the transfer means 60 in order to control the transfer means 60.

The operation of transfer from the carrier C to the temporally mounting stage 70 and that of transfer from the temporally mounting state 70 to the wafer boat 20 in the second embodiment will be described. First, the operation of transfer from the carrier C to the temporally mounting stage 70 will be stated.

Where the fork 101 is situated in a position just below a to-be-transferred target wafer W supported by the carrier C, the distance between the fork 101 and the wafer W is detected by the electrostatic capacitance sensors 120a and 120b. Subsequently, as aforementioned, the main controller 125 performs calculation based on the detection result and prestored setting information. If the detection result falls within a predetermined range, the fork 101 is slightly raised and the target wafer W is placed on the fork 101.

If, on the other hand, the detection result falls out of the range, the transfer means 60 is stopped and an alarm signal is generated. Then, an appropriate adjustment is performed and the transfer means 60 is operated again.

After confirming that the distance between the fork 101 and the wafer W falls within the preset range and placing the wafer W on the fork 101, the inclination of the wafer W is detected by the electrostatic capacitance sensors 120a and 120b.

The main controller 125 performs calculation based on the detection result and prestored setting information. If the detection result falls within the preset range, the fork 101 is retreated to take the target wafer W out of the carrier C.

If, on the other hand, the detection result falls out of the range, the transfer means 60 is stopped and an alarm signal is generated. Then, an appropriate adjustment is performed and the transfer means 60 is operated again.

Thereafter, the temporally mounting stage 70 is vertically moved relative to the arm section 100, thereby positioning the support projection 74 to support the target wafer W, at a slightly lower level than the fork 101. Subsequently, the amount of retreat of the fork 101 is adjusted on the basis of the calculation result, thereby aligning the horizontal position of a to-be-mounted edge portion of the target wafer W with that of the support projection 74. At this time, the existence of the target wafer W on the fork 101 is confirmed by means of the electrostatic capacitance sensors 120a and 120b, thereby confirming that the transfer operation can be continued. Moreover, the horizontal position of the to-bemounted edge portion of the wafer W can accurately be aligned with that of the support projection 74 by reflecting the distance between the fork 101 and the wafer W detected by the sensors 120a and 120b, upon the amount of retreat of the fork 101.

Then, the temporally mounting stage 70 is slightly raised relative to the arm section 100, thereby placing the wafer W on the support projection 74. In a similar manner, the next target wafer W is transferred from the carrier C to the temporally mounting stage 70. All the remaining wafers W supported by the carrier C are transferred to the temporally mounting stage 70 by repeating the aforementioned series of transfer operations. The transfer of wafers W to the support projections 74 of the stage 70 is performed usually in the order beginning from an uppermost one of the support projections 74.

The operation of transfer from the temporally mounting stage 70 to the wafer boat 20 will be described.

The temporally mounting stage 70 is vertically moved relative to the arm section 100, thereby positioning the support projection 74 with a target wafer W at a lower level than the fork 101 and placing the wafer W on the fork 101. At this time, the distance between the wafer W and the fork 101 is detected by the electrostatic capacitance sensors 120a and 120b. Then, the main controller 125 performs calculation based on the detection result and prestored setting information, and adjusts the amount of advance of the fork 101 on the basis of the calculation result to thereby advance the fork 101 and align the horizontal position of a to-be-mounted edge portion of the wafer W with that of the support projection 74. At this time, it is confirmed, by detecting the wafer W by the electrostatic capacitance sensors 120a and 120b, whether or not the transfer operation can be continued. Moreover, the horizontal position of the to-be-mounted edge portion of the wafer W can accurately be aligned with that of the support projection 74 by reflecting the distance between the fork 101 and the wafer W detected by the sensors 120a and 120b, upon the amount of retreat of the fork 101. Thereafter, the fork 101 is slightly lowered, where the distance between the wafer W and the fork 101 is measured by the sensors 120a and 120b.

As aforementioned, the main controller 125 performs calculation based on the detection result and the prestored setting information. If it is determined as a result of calculation that the detected distance value falls within a preset range, the fork 101 is lowered by a predetermined amount, thereby placing the wafer W on the support projection 74 of the wafer boat 20.

If, on the other hand, it is determined from the calculation that the detected distance value falls out of the preset range, the fork 101 is lowered again, and the distance between the fork 101 and the wafer W is detected again by the electrostatic capacitance sensors 120a and 120b. When it is determined that the detected distance value falls within the present range, the fork 101 is lowered by a predetermined amount, and the wafer W is placed on the support projection 74.

Subsequently, the fork 101 is retreated from the wafer boat 20. In a similar manner, the transfer of the next target wafer W is performed. All the remaining wafers W supported by the temporally mounting stage 70 are transferred to the wafer boat 20 by repeating the aforementioned series of transfer operations.

Since as described above, the positional relationship between the fork 101 and the wafer W is detected to control the transfer means 60 on the basis of the detection result in the second embodiment, the second embodiment is advantageous in that the wafers W can be transferred in a highly reliable manner, in addition to the advantages obtained in the first embodiment.

A longitudinal heat treatment apparatus according to a third embodiment of the invention will now be described.

As is shown in FIG. 13, a wafer boat 20 employed in the third embodiment comprises upper and lower end plates 21 and 22, and a plurality of support rods 131 bridging the upper and lower end plates 21 and 22 such that the rods can surround disklike wafers W. Further, as is shown in FIG. 12, a plurality (e.g. 150) of annular wafer support members 132 are supported by the support rods 131 at regular intervals in the vertical direction. The support members 132 each have an upper surface with a recess 133 formed for fitting therein a wafer W. Further, each support member 132 has an opening 134 for permitting support portions 141a and 141b of a receiving fork 141 (which will be referred to later) to pass therethrough. As described above, the wafer boat 20 of the third embodiment is constructed to support a plurality of wafers W at regular intervals in the vertical direction such that each wafer is kept horizontal. In addition, as shown in FIG. 15, the distance between each pair of adjacent support members 132 is adjusted so that the fork 101 can be positioned above each support member 132 and the receiving fork 141 can be positioned below the member 132.

Figure 16:
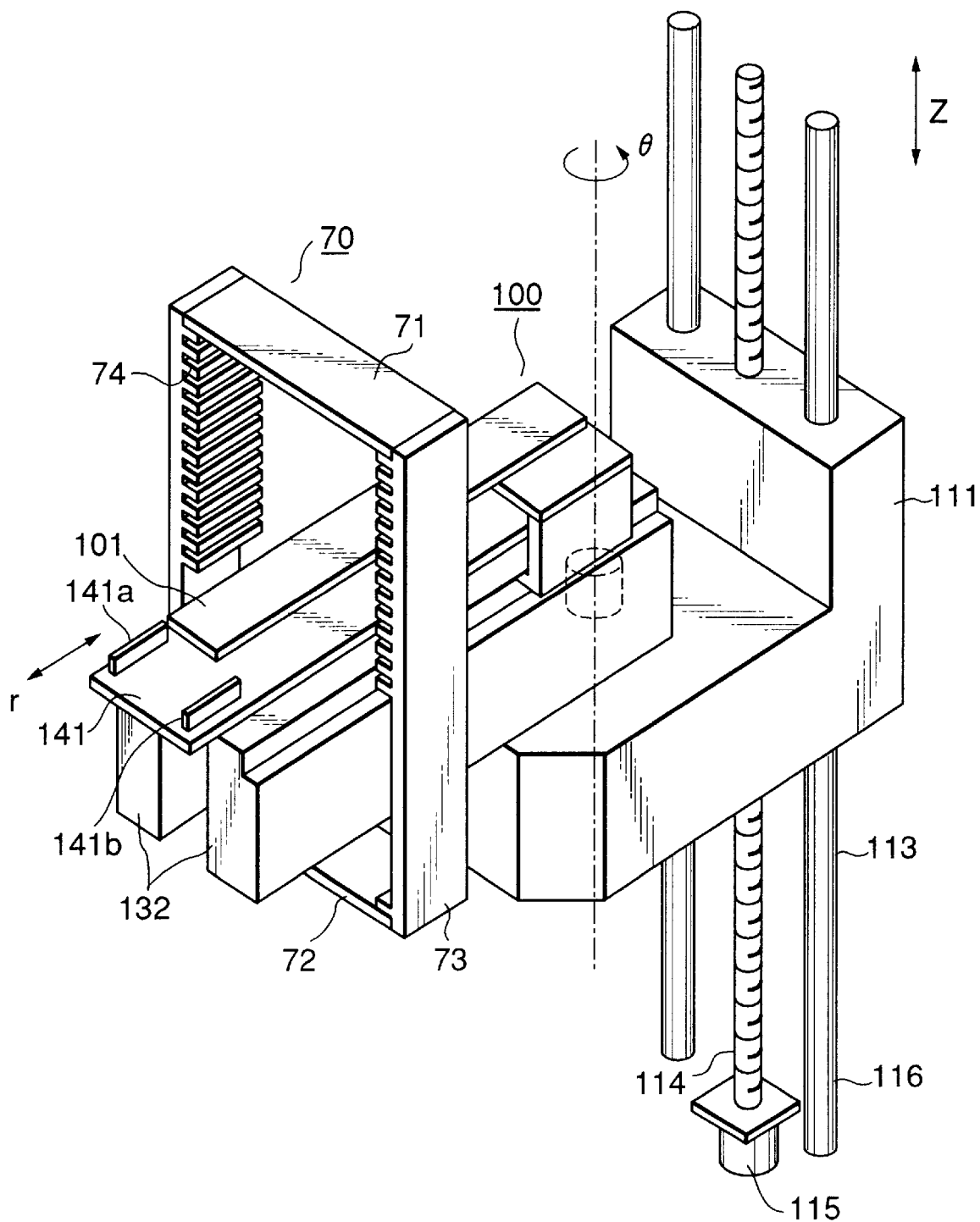
FIG. 16 is a perspective view, showing transfer means employed in the third embodiment of the present invention.
Figure 17:
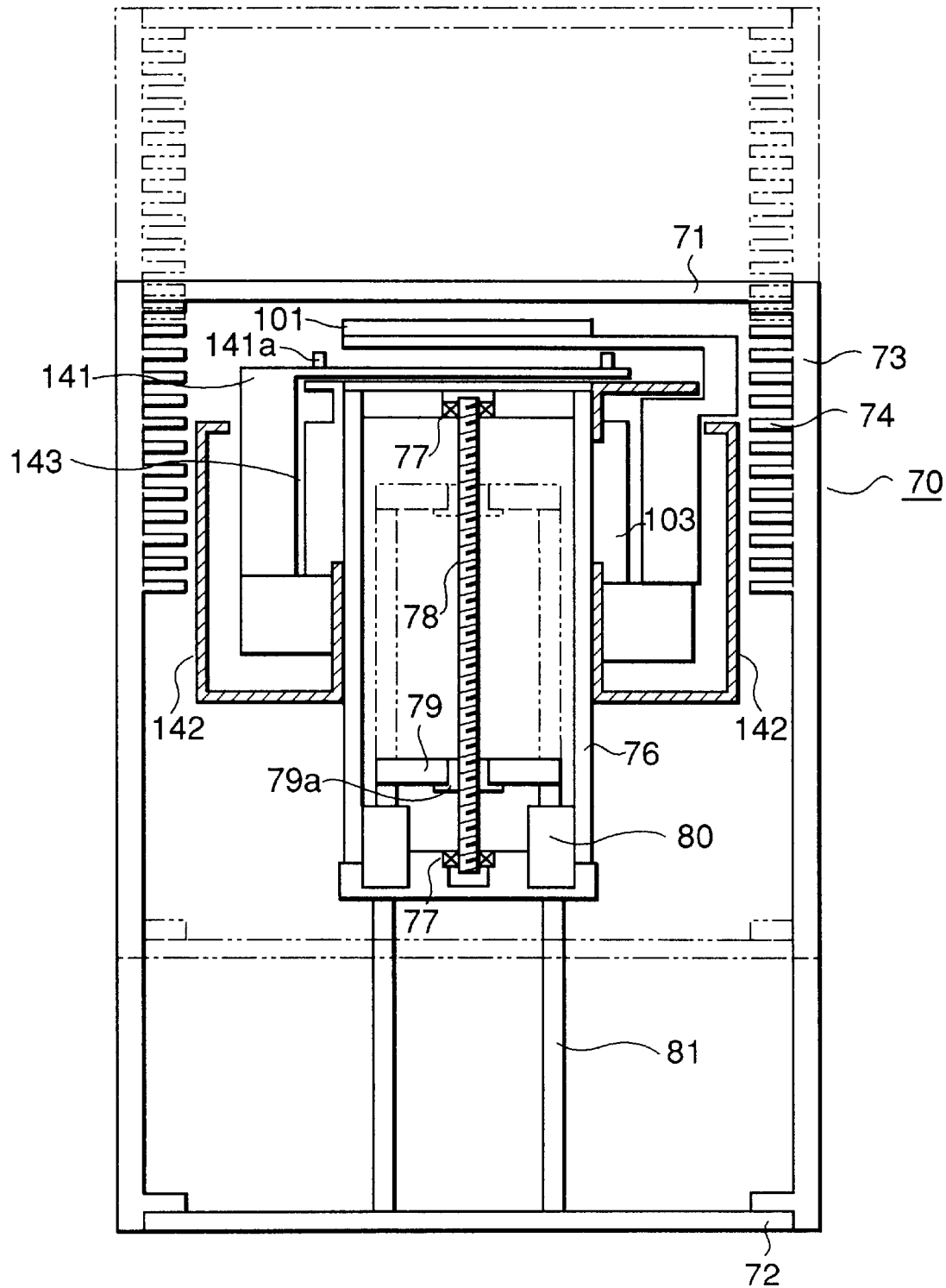
FIG. 17 is a schematic sectional view, showing load/unload means and a third support member employed in the third embodiment of the present invention.

As shown in FIGS. 16 and 17, the arm section 100 of the third embodiment comprises the fork 101 for placing a wafer W thereon, the receiving fork 141 for receiving the wafer W from below, and an arm main body 142 supporting the fork 101 and the receiving fork 141. The arm main body 142 has driving means, e.g. a linear motor 103, for moving the fork 101 forward and backward, i.e. in a direction indicated by arrow r in FIG. 16, and also driving means, e.g. a linear motor 143, for moving the fork 141 forward and backward, i.e. in the direction indicated by arrow r in FIG. 16. Support members for supporting a wafer W, e.g. two rib-shaped support members 141a and 141b, are provided on the upper surface of the receiving fork 141. The support members 141a and 141b each have a length shorter than the diameter of the opening 134 and longer than the width of the fork 101, and are adapted to interfere neither with the fork 101 nor with the wafer support member 132. The receiving fork 141 is adapted to be vertically moved independent of the fork 101 by means of another driving mechanism such as a ball screw mechanism.

Four support pins, for example, may be used as the support members in place of the rib-shaped support members 141a and 141b. However, it is preferable that the support members have a rib shape, in order to prevent the wafer W from greatly warping when it is supported by the support members.

The operation of transfer of a wafer W between the arm section 100 and the wafer boat 20 in the third embodiment will be described.

Figure 18A:
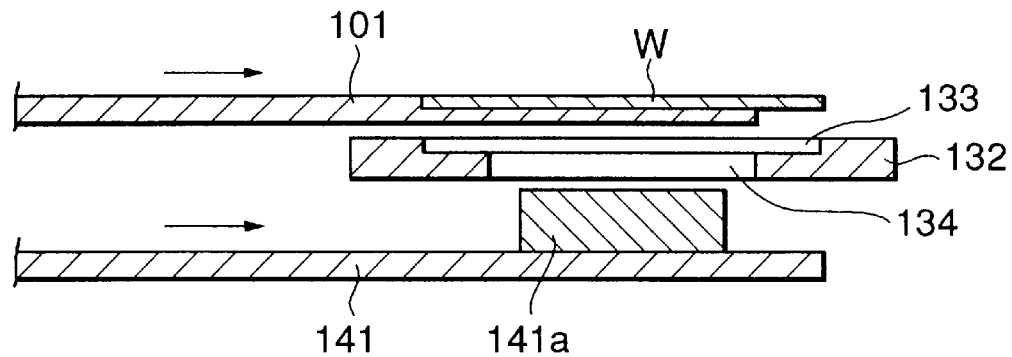
FIGS. 18A–18D are schematic sectional views, showing the operations of transfer of a wafer in the third embodiment—the operation of positioning a support member directly below an opening (FIG. 18A), the operation of raising a reception fork to transfer a wafer to the support member (FIG. 18B), the operation of retreating the fork (FIG. 18C), and the operation of lowering the fork to put the wafer into a recess in the support member (FIG. 18D).
Figure 18B:
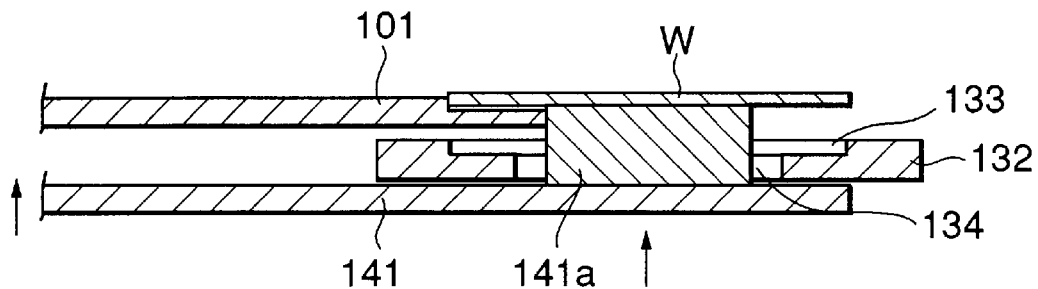
Figure 18C:
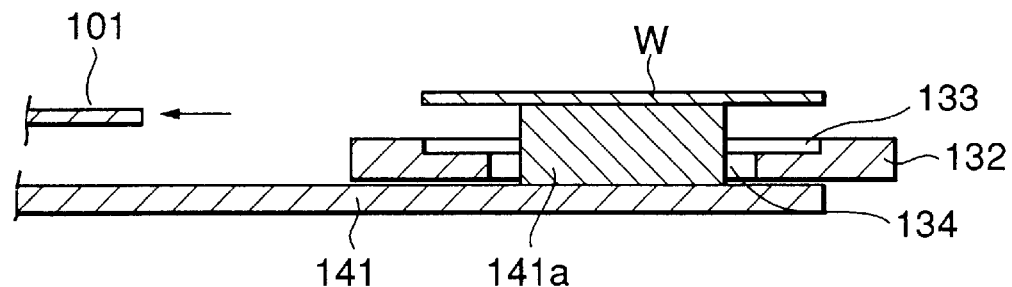
Figure 18D:
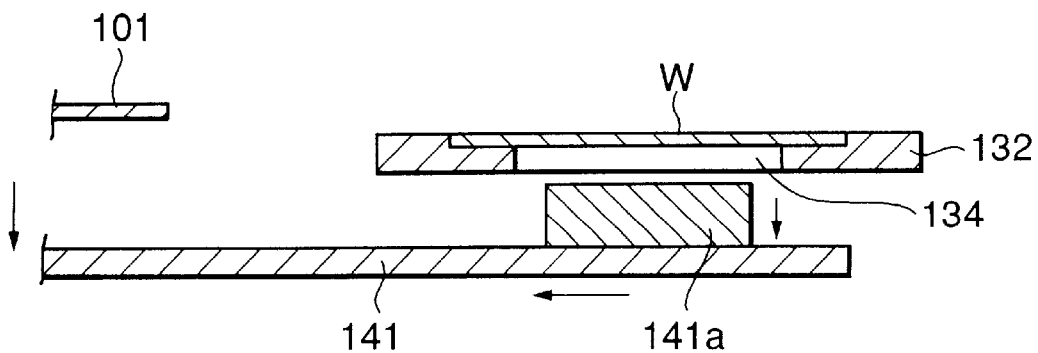

After a target wafer W is transferred from the support projection 74 of the temporally mounting stage 70 to the fork 101, the fork 101 is advanced to a position just above that one of the wafer support members 122 on which the target wafer W is to be placed. Subsequently, the receiving fork 141 is advanced and the support members 141a and 141b are positioned just below the opening 134 (FIG. 18A). Then, the receiving fork 141 is raised, thereby placing the wafer W on the support members 141a and 141b (FIG. 18B). The fork 101 is retreated (FIG. 18C). The receiving fork 141 is then lowered, thereby fitting the wafer W in the recess 133 of the wafer support member 132 (FIG. 18D). Thereafter, the receiving fork 141 is retreated. As a result of the above operations, the wafer W is transferred from the fork 101 to the recess 133 of the wafer support member 132 of the wafer boat 20.

Although each of the above-described embodiments employs an arm section 100 provided with a single fork 101 for carrying in and out wafers W one by one, the arm section may be modified such that a plurality of forks 101 are employed for carrying in and out a plurality of wafers W at a time. In this case, the number of wafers W which can be supported by the temporally mounting stage 70 is set larger than the number of the forks 101. Furthermore, although in each embodiment, the wafer W is transferred by the vertical movement of the temporally mounting stage 70 and the forward/backward movement (i.e. the r-directional movement) of the fork 101, to transfer the wafer W, it suffices if at least one of the fork 101 and the temporally mounting stage 70 may be moved vertically and horizontally relative to the other. For example, the temporally mounting stage 70 may be fixed to the arm section, and the fork 101 be moved vertically and horizontally relative to the fixed stage 70.

Although each embodiment employs The transfer method for transferring the carrier into the treatment apparatus by vertically moving the carrier, the invention is not limited to this. For example, that side wall portion of the treatment apparatus which is included in the wall portions defining the carrier take-in space may be opened to take in the carrier therethrough by horizontally moving the same.

We claim:

1. A transfer apparatus for transferring a plurality of target objects from a first support unit supporting the objects to a second support unit capable of supporting the objects, in a process of manufacturing semiconductor devices, comprising:
    an arm unit for, at a first position, unloading the objects from the first support unit, and, at a second position, loading the objects into the second support unit, the arm unit comprising a main body and a handling plate arranged on the main body to support one of the target objects and reciprocate;
    a third support unit for permitting loading and unloading of the objects by the arm unit, and for supporting the objects, the third support unit being attached to the main body of the arm unit; and
    a driving mechanism for moving the arm unit from the first position to the second position, the driving mechanism being arranged to swing and vertically move the main body of the arm unit.

2. The transfer apparatus according to claim 1, wherein the third support unit has a multi-stage structure in which the objects can be supported at regular intervals in a vertical direction and each be kept horizontal.

3. The apparatus according to claim 2, wherein the third support unit is arranged to be vertically movable relative to the main body of the arm unit.

4. The apparatus according to claim 3, wherein the third support unit is arranged to have a pair of racks one on either side of the handling plate, such that the objects supported by the handling plate and the third support unit are stacked in a vertical direction.

5. The apparatus according to claim 1, wherein the handling plate includes position detecting means for detecting a positional relationship between the handling plate and each of the objects.

6. A treatment apparatus for transferring a plurality of target objects from a first support unit supporting the objects to a second support unit capable of supporting the objects, and subjecting to a predetermined treatment the objects supported by the second support unit, in a process of manufacturing semiconductor devices, comprising:
    an arm unit for, at a first position, unloading the objects from the first support unit, and, at a second position, loading the objects into the second support unit, the arm unit comprising a main body and a handling plate arranged on the main body to support one of the target objects and reciprocate;
    a third support unit for permitting loading and unloading of the objects by the arm unit, and for supporting the objects, the third support unit being attached to the main body of the arm unit;
    a driving mechanism for moving the arm unit from the first position to the second position, the driving mechanism being arranged to swing and vertically move the main body of the arm unit; and
    a treatment section for treating the objects supported by the second support unit.

7. The apparatus according to claim 6, wherein the third support unit has a multi-stage structure in which the objects can be supported at regular intervals in a vertical direction and each of the objects be kept horizontal.

8. The apparatus according to claim 7, wherein the third support unit is arranged to be vertically movable relative to the main body of the arm unit.

9. The apparatus according to claim 8, wherein the third support unit is arranged to have a pair of racks, on one of either side of the handling plate, such that the objects supported by the handling plate and the third support unit are stacked in a vertical direction.

10. The apparatus according to claim 6, wherein the handling plate includes position detecting means for detecting a positional relationship between the handling plate and each of the objects.

11. A method of transferring a plurality of target objects from a first support unit supporting the objects to a second support unit capable of supporting the objects, in a process of manufacturing semiconductor devices, comprising the steps of:
    unloading the objects one by one out of the first support unit into a third support unit capable of supporting the objects by an arm unit placed at a first position, the third support unit being attached to the arm unit;
    swinging and vertically moving the arm unit for the arm unit to move from the first position to a second position, and for the third support unit with the objects to move to a position adjacent to the second position; and
    unloading the objects one by one from the third support unit into the second support unit by the arm unit placed at the second position.

12. The method according to claim 4, wherein the arm unit comprises a main body and a handling plate arranged on the main body to support one of the target objects and reciprocate, and the third support unit is attached to the main body of the arm unit.

13. The method according to claim 12, wherein the third support unit has a multi-stage structure in which the objects can be supported at regular intervals in a vertical direction and each of the objects be kept horizontal.

14. The method according to claim 13, wherein the third support unit is arranged to be vertically movable relative to the main body of the arm unit.

15. The method according to claim 14, wherein the third support unit is arranged to have a pair of racks, one on either side of the handling plate, such that the objects supported by the handling plate and the third support unit are stacked in a vertical direction.

16. The method according to claim 12, wherein the handling plate includes a position detecting means for detecting a positional relationship between the handling plate and each of the objects.

17. A method of subjecting, to a predetermined treatment, a plurality of target objects transferred from a first support unit to a second support unit, in a process of manufacturing semiconductor devices, comprising the steps of:

unloading the objects one by one out of the first support unit into a third support unit capable of supporting the objects by an arm unit placed at a first position, the third support unit being attached to the arm unit;

swinging and vertically moving the arm unit for the arm unit to move from the first position to a second position, and for the third support unit with the objects to move to a position adjacent to the second position;

unloading the objects one by one from the third support unit into the second support unit by the arm unit placed at the second position;

shifting the second support unit with the objects to a treatment section; and subjecting the objects supported by the second support unit to the predetermining treatment in the treatment section.

18. The method according to claim 17, wherein the arm unit comprises a main body and a handling plate arranged on the main body to support one of the target objects and reciprocate and the third support unit is attached to the main body of the arm unit.

19. The method according to claim 18, wherein the third support unit has a multi-stage structure in which the objects can be supported at regular intervals in a vertical direction and each of the objects be kept horizontal.

20. The method according to claim 19, wherein the third support unit is arranged to be vertically movable relative to the main body of the arm unit.

21. The method according to claim 20, wherein the third support unit is arranged to have a pair of racks, one of either side of the handling plate, such that the objects supported by the handling plate and the third support unit are stacked in a vertical direction.

22. The method according to claim 18, wherein the handling plate includes position detecting means for detecting a positional relationship between the handling plate and each of the objects.

* * * * *